United States Patent [19]
Nishii et al.

[11] Patent Number: 5,851,938
[45] Date of Patent: Dec. 22, 1998

[54] GLASS MATERIAL VARIABLE IN VOLUME BY IRRADIATION WITH ULTRAVIOLET LIGHT

[75] Inventors: Junji Nishii; Hiroshi Yamanaka, both of Ikeda, Japan

[73] Assignee: Agency of Industrial Science & Technology, Tokyo, Japan

[21] Appl. No.: 966,858

[22] Filed: Nov. 10, 1997

Related U.S. Application Data

[63] Continuation of Ser. No. 753,601, Nov. 27, 1996, abandoned.

[30] Foreign Application Priority Data

Dec. 8, 1995 [JP] Japan .................................. 7-345688

[51] Int. Cl.$^6$ .............................. C03C 3/04; B32B 17/06
[52] U.S. Cl. ..................... 501/54; 501/55; 204/192.15; 204/192.23; 428/426; 428/428
[58] Field of Search ................................ 501/12, 54, 55; 204/192.15, 192.23; 428/426, 428

[56] References Cited

U.S. PATENT DOCUMENTS

| | | | |
|---|---|---|---|
| 4,477,580 | 10/1984 | Fleming, Jr. .............................. | 501/12 |
| 4,490,737 | 12/1984 | Pierce et al. .............................. | 501/55 |
| 4,916,048 | 4/1990 | Yamada et al. .......................... | 430/523 |
| 5,287,427 | 2/1994 | Atkins et al. ............................. | 385/124 |

OTHER PUBLICATIONS

"Photosensitivity in Optical Fiber Waveguides: Application to Reflection Filter Fabrication", American Institute of Physics, vol. 32, No. 10, May 15, 1978, pp. 647–649.

"Photosensitivity of Solgel–Derived Germanosilicate Planar Waveguides", Optical Society of America, vol. 18, No. 1, Jan. 1, 1993, pp. 25–27.

"248nm Induced Vacuum UV Spectral Changes in Optical Fibre Preform Cores: Support for a Colour Centre Model of Photosensitivity", Electronics Letters, vol. 29, No. 4, Feb. 18, 1993, pp. 385–387.

"Characteristics of 5–eV Absorption Band in Sputter Deposited $GeO_2$–$SiO_2$ Thin Glass Films", Nishii et al, *Applied Phys. Ltr.*, vol. 64, No. 3, Jan. 17, 1994, pp. 282–284.

"Novel Process for the Production of Large, Stable Photosensitivity in Glass Films", Simmons–Potter et al, *Applied Phys. Ltr.*, vol. 68, No. 14, Apr. 1, 1996, pp. 2011–2013.

"Preparation of Bragg Gratings in Sputter–Deposited $GeO_2$–$SiO_2$ Glasses by Excimer–Laser Irradiation", Nishii et al, *Optics Letters*, vol. 21, No. 17, Sep. 1, 1996, pp. 1360–1362.

*Primary Examiner*—Karl Group
*Attorney, Agent, or Firm*—Nikaido, Marmelstein, Murray & Oram LLP

[57] ABSTRACT

A glass material variable in volume by irradiation with ultraviolet light has a $GeO_2$—$SiO_2$ glass composition having a $GeO_2$ content of 0.5 to 90 mol %, and is in the form of a thin film formed in an argon atmosphere or in an argon-oxygen mixed gas atmosphere by the high-frequency sputtering method.

4 Claims, 1 Drawing Sheet

GLASS MATERIAL VARIABLE IN VOLUME BY IRRADIATION WITH ULTRAVIOLET LIGHT

This application is a continuation of application Ser. No. 08/753,601 filed Nov. 27, 1996, now abandoned.

BACKGROUND OF THE INVENTION

The present invention relates to a glass material variable in volume by irradiation with ultraviolet light (hereinafter often referred to as a "variable-volume glass material").

A silica glass capable of transmitting light in the ultraviolet to near infrared range is used as the matrix of an optical communication fiber, the core portion of which is usually doped with $GeO_2$. It has been found out that this optical fiber is increased by about $1 \times 10^{-4}$ in the refractive index of the core thereof when irradiated with an argon ion laser beam of 488 nm in wavelength or an excimer laser beam of 248 nm in wavelength (K. O. Hill et al., Applied Physics Letters, Vol. 32, No. 10, 1978, P.P. 647~649, and R. M. Atkins et al., Electronics Letters, 1993, Vol. 29, No. 4, P.P. 385~387). It has been reported that the mechanism of refractive index change is sequential occurrence of two processes: (1) that structural defects are induced in the glass by light to bring about strong absorption in the ultraviolet range, and (2) that the density of the glass is increased, i.e., the volume thereof is decreased due to formation of the structural defects.

A refractive index change is also recognized in a $GeO_2$—$SiO_2$ glass produced by the sol-gel method (K. D. Simnon et al., Optics Letter, 1993, Vol. 18, No. 1, P.P. 25~27). In this case, however, the amount of refractive index change is no more than about $3 \times 10^{-5}$.

In both the foregoing cases, therefore, a difficulty is encountered in applying the glass to a hologram and the like in which cases a level of $10^{-2}$ is required as the amount of refractive index change.

Further, ion exchange, crystallization, etc. have been proposed as means for realizing an increase in the volume of glass by irradiation thereof with light. However, there are no reports on a glass wherein volume expansion thereof can be induced by irradiation thereof with light at room temperature while keeping it in an amorphous state.

SUMMARY OF THE INVENTION

Accordingly, a principal object of the present invention is to provide a glass material wherein volume expansion thereof by a level of $10^{-2}$ can be induced by irradiation thereof with ultraviolet light at room temperature while keeping it in an amorphous state.

As a result of intensive investigations made having regard to the foregoing status of the prior art, the inventors of the present invention have found out that the foregoing object can be attained when a glass having a specific composition is used to form a thin glass film in a specific gas atmosphere controlled in oxygen content by the high-frequency sputtering method.

Specifically, the present invention provides a glass material wherein a volume change thereof by a level of $10^{-2}$ can be induced by irradiation thereof with ultraviolet light, and particularly a glass material variable in volume by irradiation with ultraviolet light which material has a $Geo_2$—$SiO_2$ glass composition having a $GeO_2$ content of 0.5 to 90 mol %, and is in the form of a thin film formed in an argon atmosphere or in an argon-oxygen mixed gas atmosphere having an oxygen content of at most 20 vol. % by the high-frequency sputtering method.

In a thin $GeO_2$—$SiO_2$ glass film formed under specific conditions by the high-frequency sputtering method according to the present invention, an increase by a level of $10^{-2}$ in the volume thereof can be induced by irradiation thereof with an ultraviolet laser beam at room temperature while keeping it in an amorphous state. Accordingly, it is applicable to an optical memory, a hologram recording medium, etc.

DESCRIPTION OF THE PREFERRED EMBODIMENTS

Figure 1:
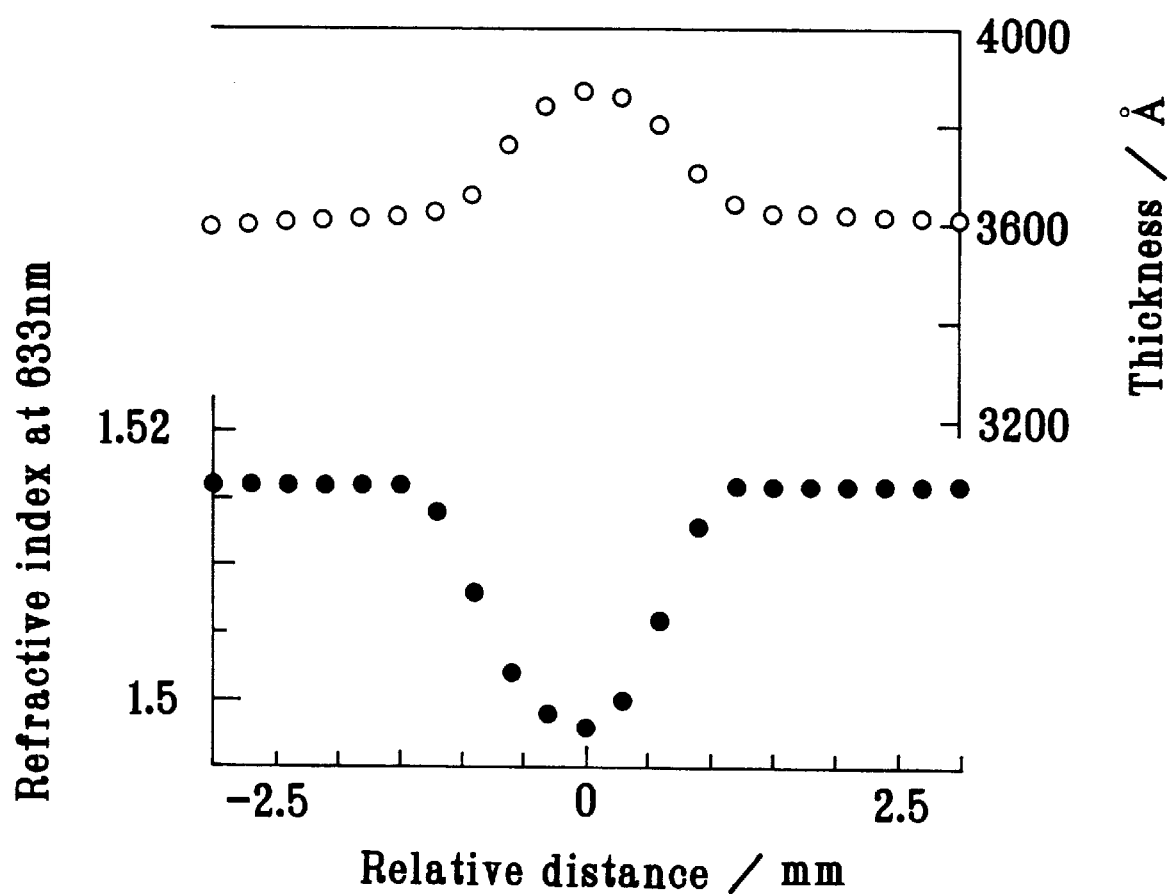
FIG. 1 is a two-dimensional diagram showing a change in the refractive index of the glass material of the present invention and a change in the thickness thereof after the glass material is irradiated with ultraviolet radiation.

The optical induction variable-volume glass material made of $GeO_2$—$SiO_2$ glass according to the present invention is obtained in the form of a thin film on a substrate such as a single silicon crystal by the high-frequency sputtering method. $GeO_2$—$SiO_2$ glass is especially useful since it is high in transparency in the visible light range and excellent in chemical durability and mechanical durability.

A $GeO_2$—$SiO_2$ glass having a $Ge_2O$ content of 0.5 to 90 mol %, preferably 3 to 60 mol %, is especially suitably used as such glass. When the $GeO_2$ content is too low, the $GeO_2$—$SiO_2$ glass cannot secure a large volume change when irradiated with light. On the other hand, when it is too high, the glass is sometimes colored yellow or lowered in water resistance.

High-frequency sputtering can be effected in an argon or argon-oxygen mixed gas atmosphere (oxygen content: at most 20 vol. %, preferably at most 10 vol. %) according to a customary method though conditions thereof are not particularly limited. When the oxygen content of the argon-oxygen mixed gas atmosphere exceeds 20 vol. %, a thin film having the desired feature of being variable in volume by irradiation thereof with ultraviolet light cannot be obtained. The thickness of the thin glass film is usually about 0.1 to 10 $\mu$m (100 to 100,000 Å).

The thin film thus obtained may be heat-treated in vacuo or in an inert gas such as argon or nitrogen at 200° to 800° C., preferably 300° to 650° C., for the purpose of adjusting the volume change thereof and improving the laser beam resistance, etc. thereof.

The light usable for inducing volume expansion of the thin film is preferably an ultraviolet light of at most 400 nm in wavelength. A more specific preferable light source is a pulse laser of at least 1 $mJ/cm^2$ in energy density, examples of which include an argon-fluorine (ArF) excimer laser of 193 nm in wavelength, a krypton-fluorine (KrF) excimer laser of 248 nm in wavelength, a xenon-chlorine (XeCl) excimer laser of 308 nm in wavelength, a xenon-fluorine (XeF) excimer laser of 350 nm in wavelength, and yttrium-aluminum-garnet (YAG) lasers respectively emitting third harmonics (355 nm) and fourth harmonics (266 nm).

The features of the present invention will now be made clearer while showing Examples and Comparative Examples.

EXAMPLE 1

A thin glass film of 33 mol % $GeO_2$—67 mol % $SiO_2$ was deposited on a single silicon crystal substrate at a rate of about 8 nm/min over about 15 minutes under conditions involving a gas atmosphere composition of 100% argon (Ar), a gas flow rate of 3 cc/min and a pressure of about $10^{-2}$ Torr in a chamber. Desired adjustment of the composition of the thin film was confirmed by XPS (X-ray photoelectron spectroscopy).

Further, a thin film of about 6 μm in thickness was formed on a $SiO_2$ glass substrate according to substantially the same procedure as described above, and then examined by X-ray diffractometry to observe no sharp diffraction peaks assigned to $GeO_2$ or $SiO_2$.

The thin glass film thus obtained was heat-treated in vacuo at 500° C. for 1 hour, and then irradiated with 1,200 ArF excimer laser beam pulses of 248 nm in wavelength and 10 mJ/cm² in power density. Thereafter, the refractive index of it was examined with an ellipsometer using an He—Ne laser of 633 nm in wavelength as the light source. The results are shown in FIG. 1.

As is apparent from FIG. 1, it was confirmed that the thin film was increased by about 8% in thickness, i.e., volume, in the region thereof irradiated with the laser beam to be thereby decreased by about 1.2% in refractive index.

EXAMPLE 2

A thin glass film of 50 mol % $GeO_2$—50 mol % $SiO_2$ formed in substantially the same manner as in Example 1 was heat-treated in an argon atmosphere at 500° C. for 1 hour, and then irradiated with the same excimer laser beam pulses as in Example 1. Thereafter, the refractive index of it was examined with the ellipsometer using the He—Ne laser of 633 nm in wavelength as the light source. As a result, it was confirmed that the thin film was increased by about 10% in thickness in the region thereof irradiated with the laser beam to be thereby decreased by about 1.5% in refractive index.

EXAMPLE 3

A thin film formed using a glass having a 5 mol % $GeO_2$—95 mol % $SiO_2$ glass composition in substantially the same manner as in Example 1 was heat-treated in vacuo at 500° C. for 1 hour, and then irradiated with 1,400 ArF excimer laser beam pulses in substantially the same manner as in Example 1. Thereafter, the refractive index of it was examined with the ellipsometer using the He—Ne laser of 633 nm in wavelength as the light source. As a result, it was confirmed that the thin film was increased by 1% in thickness in the region thereof irradiated with the laser beam to be thereby decreased by 0.15% in refractive index.

EXAMPLE 4

A thin film formed using a glass having a 55 mol % $GeO_2$—45 mol % $SiO_2$ glass composition in substantially the same manner as in Example 1 was heat-treated in vacuo at 500° C. for 1 hour, and then irradiated with 1,100 XeCl excimer laser beam pulses in substantially the same manner as in Example 1. Thereafter, the refractive index of it was examined with the ellipsometer using the He—Ne laser of 633 nm in wavelength as the light source. As a result, it was confirmed that the thin film was increased by 6% in thickness in the region thereof irradiated with the laser beam to be thereby decreased by 0.9% in refractive index.

EXAMPLE 5

A thin film formed using a glass having a 20 mol % $GeO_2$—80 mol % $SiO_2$ glass composition in substantially the same manner as in Example 1 was heat-treated in vacuo at 500° C. for 1 hour, and then irradiated with 1,400 KrF excimer laser beam pulses in substantially the same manner as in Example 1. Thereafter, the refractive index of it was examined with the ellipsometer using the He—Ne laser of 633 nm in wavelength as the light source. As a result, it was confirmed that the thin film was increased by 5% in thickness in the region thereof irradiated with the laser beam to be thereby decreased by 0.75% in refractive index.

EXAMPLE 6

A thin film formed using a glass having a 55 mol % $GeO_2$—45 mol % $SiO_2$ glass composition in substantially the same manner as in Example 1 was heat-treated in vacuo at 500° C. for 1 hour, and then irradiated with 1,100 YAG laser beam pulses of 266 nm in wavelength in substantially the same manner as in Example 1. Thereafter, the refractive index of it was examined with the ellipsometer using the He—Ne laser of 633 nm in wavelength as the light source. As a result, it was confirmed that the thin film was increased by 4% in thickness in the region thereof irradiated with the laser beam to be thereby decreased by 0.6% in refractive index.

Comparative Example 1

A thin $SiO_2$ glass film was deposited on a single silicon crystal substrate at a rate of about 8 nm/min over about 15 minutes under conditions involving a gas atmosphere composition of 100% argon (Ar), a gas flow rate of 3 cc/min and a pressure of about $10^{-2}$ Torr in a chamber.

The thin glass film thus obtained was irradiated with 6,000 ArF excimer laser beam pulses of 248 nm in wavelength and 10 mJ/cm² in power density. Thereafter, the refractive index of it was examined with the ellipsometer using the He—Ne laser of 633 nm in wavelength as the light source to recognize no change in the refractive index thereof.

Comparative Example 2

A 33 mol % $Geo_2$—67 mol % $SiO_2$ glass was deposited on a silicon substrate under substantially the same conditions as in Comparative Example 1, and then irradiated with ArF excimer laser beam pulses of 248 nm in wavelength and 10 mJ/cm² in power density, whereby the surface of the thin film was thermally damaged to make it impossible to evaluate the refractive index thereof with the ellipsometer.

Comparative Example 3

Sputtering of a 20 mol % $GeO_2$—80% mol $SiO_2$ glass on a single silicon crystal substrate was attempted under conditions involving a gas atmosphere composition of 35% $O_2$—65% argon (Ar), a gas flow rate of 3 cc/min and a pressure of about $10^{-2}$ Torr in a chamber. The deposition rate was very slow. Moreover, no substantial change in the refractive index of the resulting thin glass film by irradiation thereof with light was recognized.

It will be apparent that a wide variety of different embodiments are possible without any departure from the spirit and ambit of the present invention. Accordingly, the present invention is not restricted to the specific embodiments thereof except for the limitations as specified in the appended claims.

What is claimed is:

1. A glass material expansible in volume by irradiation thereof with ultraviolet light, said glass material being reducible in refractive index by irradiation thereof with ultraviolet light, said glass material having a $GeO_2$—$SiO_2$ glass composition having a $GeO_2$ content of 0.5 to 90 mol %, and is in the form of a thin film formed on a substrate in an argon-oxygen mixed gas atmosphere having an oxygen content of at most 10 vol % by a high-frequency sputtering method, said ultraviolet light having a wavelength of at most 400 nm.

2. A glass material as claimed in claim 1, wherein said $GeO_2$ content is 3 to 60 mol %.

3. A glass material as claimed in claim 1, wherein said thin film as an intermediate material is heat-treated in vacuo at 200° to 800° C. before the volume change thereof is induced by irradiation with ultraviolet light.

4. A glass material as claimed in claim 3, wherein the heat treatment temperature is 300° to 650° C.

* * * * *